United States Patent [19]

Currie

[11] Patent Number: 4,561,006

[45] Date of Patent: Dec. 24, 1985

[54] INTEGRATED CIRCUIT PACKAGE WITH INTEGRAL HEATING CIRCUIT

[75] Inventor: Thomas P. Currie, St. Paul, Minn.

[73] Assignee: Sperry Corporation, New York, N.Y.

[21] Appl. No.: 395,551

[22] Filed: Jul. 6, 1982

[51] Int. Cl.[4] .................. H01L 21/48; H01L 23/14; H01L 23/18; H01L 23/34

[52] U.S. Cl. .................................. 357/28; 357/74; 357/75

[58] Field of Search .................. 357/74, 75, 28

[56] References Cited

U.S. PATENT DOCUMENTS

| | | | |
|---|---|---|---|
| 3,289,046 | 11/1966 | Carr | 357/75 |
| 3,419,767 | 12/1968 | Dahlberg | 357/28 |
| 3,444,399 | 5/1969 | Jones | 357/28 |
| 3,551,645 | 12/1970 | Stoll | 357/28 |
| 4,107,019 | 8/1978 | Takao et al. | 357/28 |
| 4,232,212 | 11/1980 | Baraff et al. | 357/28 |

Primary Examiner—Andrew J. James
Assistant Examiner—Sheila V. Clark
Attorney, Agent, or Firm—Charles A. Johnson; Kenneth T. Grace; Marshall M. Truex

[57] ABSTRACT

An integrated circuit package having an auxiliary heating element incorporated therein is described. The integral heating element is accessible for application of electric power from an external source to cause heating of the integral circuit package to a predetermined level at which solder will melt and flow, thereby allowing removal and reinsertion of the integrated circuit package with relationship to associated pins in a support assembly. The integral heating element provides a means for applying controlled heat to the integrated circuit package such that the package can be unsoldered from or soldered to associated electrical interconnection pins, some of which may be hidden from view or physical access.

14 Claims, 10 Drawing Figures

METAL LAYER 4

METAL LAYER 5

METAL LAYER 6: TUNGSTEN, EXPOSED
NICKEL & GOLD

INTEGRATED CIRCUIT PACKAGE WITH INTEGRAL HEATING CIRCUIT

BACKGROUND OF THE INVENTION

1. Field of the Invention

This invention relates to an improved circuit package. More particularly, it relates to an integrated circuit package having an integral heating circuit for use in raising the temperature of the integrated circuit package sufficiently to melt solder for use in removing the integrated circuit package from a system, or making reflow reconnect into a system.

2. State of the Prior Art

The fabrication of integrated circuit components involves the fabrication of an integrated circuit die, often referred to as a chip, that performs the desired electrical or logical function. Chips are of varying sizes, with the main thrust of development to further miniaturize. Miniaturization leads to availability of ever-increasing logic of circuit functions on smaller substrates. Miniaturization increases circuit density and tends to require more leads to be provided for input and output signals and application of power. As leads were made smaller, manual installation and removal techniques became inefficient and in many cases almost impossible to accomplish.

In order to make interconnection to the integrate circuit substrate or chip, it is common to provide a package that will make interconnection with the terminals on the chip and provide means for making electrical interconnection into the system with which the chip will be used. The package characteristically supports the chip, and includes circuit interconnections for making electrical connection to terminals on the chip, and for making electrical interconnection to pins for interconnecting the wiring in a support assembly.

In the fabrication process, it is known to provide advantageous results to utilize step soldering techniques. This involves selecting solders that melt at different temperatures for use in different steps of fabrication. For example, a relatively high melting temperature solder is utilized for soldering the chip to the leads of the integrated circuit package. When a cover is to be soldered over the chip cavity, a medium temperature solder is selected. A relatively low melting temperature solder is selected for making the electrical interconnection of the terminals of the integrated circuit package to the pins that mount to the support chassis. Through utilization of the step solder selection, sufficient heat can be applied to melt the solder, thus allowing removal of the integrated circuit package from connection with the chassis without causing the entire assembly to be unsoldered.

Once the chip and integrated package have been installed in an operating system, it sometimes is necessary to accomplish removal for maintenance and repair purposes. In the prior art, various systems and techniques have been devised for applying sufficient heat to the integrated circuit terminals of package to cause the solder making connection with the chassis pins to melt. One such technique is to provide a heated air jet that is applied directly on the package terminals. The characteristics of air are such that it must be raised to an extremely high temperature in order to provide sufficient thermal transmission to melt the solder. Further, due to the very small size of the integrated circuit packages, it is extremly difficult to accurately direct the air flow on the interconnecting pins. The air flow technique is relatively slow and requires special rework equipment.

Another prior art technique to remove integrated circuit packages is to simply apply a conventional soldering iron to the surface of the package. This allows the heat from the iron to permeate through the package and melt the solder at the chassis pins for either removal or reinsertion of the integrated circuit package. This system has many disadvantages but presently is the most widely used system due to general availability of soldering irons at rework or test facilities. A primary problem is the unknown temperature of the tip of the iron when it is applied to the integrated circuit package. Characteristically, the iron is pre-heated, and a 100 Watt iron can have tip temperature on the order of 420° Centigrade. When preheated to a temperature that will provide adequate heat transfer to the package, it is not uncommon for the soldering iron to be at a temperature more than two times that required to melt the pin solder. This high temperature can lead to the undesired results of cracking the package material, damaging the chip, and raising the entire assembly to a temperature that causes melting of all of the solder types in the package. For rework and reinstallation, the uncontrolled application of heat is difficult to control and can cause the cover to become unsealed from the package or cause the chip to lose good contact to the package. In addition to damage to the integrated circuit or the package, this application of heat can result in damage to heat sinks that might be associated with the circuit.

Tools have been developed which are designed to contact each solder joint, but such tools have been found to interfere with the formation of a new solder joint when a replacement part is installed. These tools also have been found to fail to contact all solder joints equally.

SUMMARY OF THE INVENTION

With the foregoing in mind, the present invention provides an improved integrated circuit package having a support structure for supporting an associated integrated circuit element wherein electrical circuits are deposited in layers for making interconnection of the integrated circuit leads to pins for making connections on a supporting assembly. An additional circuit element capable of having a source of external power applied to it is incorporated in the package and is electrically insulated from the conductive circuits that are electrically interconnected to the integrated circuit chip. The arrangement is such that when a source of external power is applied to the additional circuit element, a current passes therethrough and results in the generation of heat within the integrated circuit package. The level of temperature elevation is controlled by the resistance of the circuit element in combination with the power applied. Sufficient resistance is incorporated in the additional circuit element to allow a temperature rise to a level such that solder utilized for interconnecting the pins to the integrated circuit package will be caused to melt and flow, thereby allowing the integrated circuit package to be removed from an existing system or to be reinstalled in the system.

OBJECTS

In view of the foregoing, it is the primary object of the invention to provide an improved integrated circuit package having an additional circuit element that is a heating element incorporated there, capable of raising the package temperature sufficiently to cause solder to melt and flow when power is applied to the additional circuit element.

Still another object of the invention is to provide an improved integrated circuit package that includes an additional circuit element that is a resistive element, to which a source of external power can be applied for raising the temperature of the integrated package in a controlled manner, thereby eliminating the need of applying conductive heat to the integrated circuit package or associated pins for soldering.

Yet a further object of the invention is to provide an improved integrated circuit package having an additional circuit element that is a heating element integrated therein that permits the temperature of the integrated circuit package to be raised to a predetermined temperature level by application of an external power source to the heating element where the temperature level can be controlled within a step solder system.

Another object of the invention is to provide an improved integrated circuit package having an externally controlled additional circuit element that is a heat generating resistive element incorporated therein for use in solder reflow installation and removal operations, whereby damage to the integrated circuit package or integrated circuit element is minimized by controlling the temperature rise to only those levels necessary to cause solder to melt and flow.

Yet a further object of the invention is to provide an improved integrated circuit package having an externally controlled circuit element that includes a resistive element integrated therein, capable of raising the integrated circuit to a predetermined temperature causing solder reflow, whereby the integrated circuit package can reliably be removed and reinstalled in a system without having to make physical contact with the interconnection pins with a heating element.

These and other more detailed and specific objectives of the invention will be described and shown in the drawings and the description of the preferred embodiment.

DESCRIPTION OF THE PREFERRED EMBODIMENT

Figure 1:
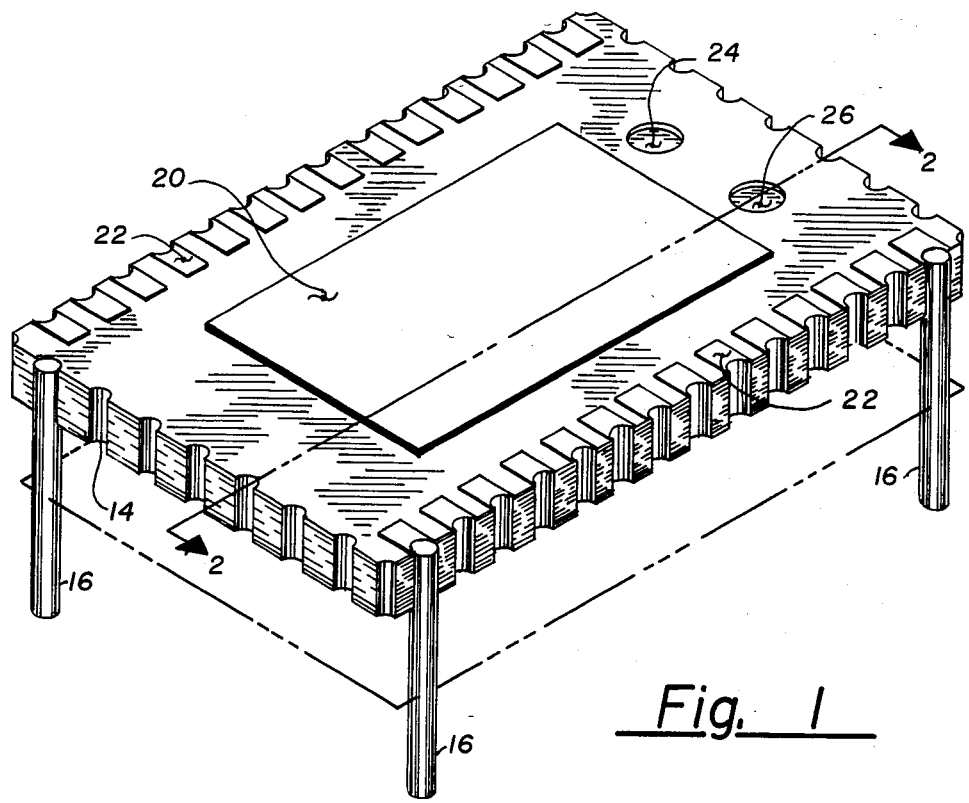
FIG. 1 is a three-dimensional view of the integrated circuit package that incorporates the additional circuit element externally controlled as a heat generating circuit of the present invention.

FIG. 1 is a three-dimensional view of the integrated circuit package that incorporates the additional circuit element externally controlled as a heat generating circuit of the present invention. The body 10 is comprised of a plurality of layers of alumina ceramic, each having patterns of conductive material coated thereon. A plurality of edge slots 14 are adapted for interconnection with conductive pins 16, each of the pins being soldered in a respectively associated slot 14. The pins 16 are utilized for making interconnection to the integrated circuit chip supported in the integrated circuit package, as will be described in more detail below, to the printed circuit assembly for making circuit interconnections between integrated circuits. The form of pin electrical interconnection is known and will not be described further, it being understood that the present invention relates to solder reflow interconnection or removal of the integrated circuit package 10 in connection with the pins 16. An exposed conductive surface 20 is deposited on the upper layer of the integrated circuit package 10, and in this configuration is utilized for establishing ground connection to the integrated circuit package during testing of the part. Interconnection tabs 22 are also deposited on the upper surface of integrated circuit package 10, and form structural support and electrical interconnection for mounting to the pin 16 along the sides of the integrated circuit housing. Apertures 24 and 26 provide access to the additional circuit element (not shown) that forms the heat generating element, and that is embedded within the integrated circuit package. Aperture 24 and 26 comprise the points of physical access at which power is applied to the additional circuit element when reflow soldering is desired.

Figure 2:
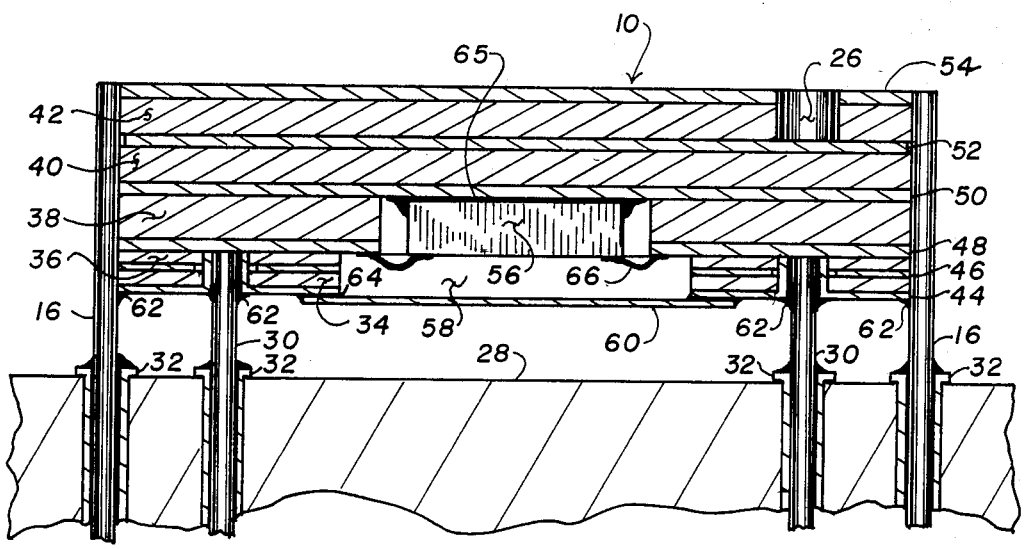
FIG. 2 is a sectional view taken along line 2—2 and FIG. 1, and illustrates the layered structure of the integrated circuit package.

FIG. 2 is a sectional view taken along line 2—2 in FIG. 1, and illustrates the layered structure of the integrated circuit package. A printed circuit support assembly with edge, pins 16 and hidden pins 30 soldered thereto by solder connections 32. It should be understood that only a limited number of the pins 16 and the hidden pins 30 are shown, and that in actual use, there would be many more such pins. The integrated circuit package 10 has a first ceramic layer 34, a second ceramic layer 36, a third ceramic layer 38, a fourth ceramic layer 40, and a fifth ceramic layer 42. The number of layers can vary in different packages. In the configuration illustrated, there are six metal layers 44, 46, 48, 50, 52, and 54, interleaved with the ceramic layers. The additional circuit element used as the heat generating element when external power is applied, is situated in metallic layer 52. Aperture 26 (and 24) provides opening (s) for physical access through ceramic substrate 42 to the surface of the additional circuit element that forms the heat generating resistive element in metallic layer 52, such that external electrical power can be applied thereto. An integrated circuit chip 56 is mounted within cavity 58, and when mounted in place is covered by lid 60. The solder joints 62 are selected to melt and flow by application of heat at a first temperature. By way of illustration, the first temperature is selected in a range of 180° Centigrade to 190° Centigrade, and nominally is selected at 183° Centigrade. The second solder step at solder interconnection 64 is for holding lid 60 in place, and is selected to be a solder connection that will melt and flow at a temperature higher than the first temperature. By way of example, the solder connection 64 is selected to have a nominal solder melt and flow temperature at 280° Centigrade. The connection of the integrated circuit die 56 to the fourth metallic layer 50 is by solder connections 65, and is selected to require the highest application of temperature to cause the solder to melt and flow. By way of example, solder for making solder connections 65 is selected to require temperatures in the range of 370° Centigrade. The solder selected for making solder connections 32 is the same as that used on solder connections 32. Solder connections 62 do not melt during application of heat to the package 10 because the edge pins 16 and the hidden pins 30 do not conduct enough heat to the printed circuit board 28. This is desirable since the removal of the pins from board 28 results in a very difficult task of reinsertion for normal integrated circuit chip rework. Instead soldered bonds 62 melt and allow the removal (or reconnection) of package 10 from the pins 16 and 30. After the die 56 is soldered to layer 50, its terminals are wire bonded to the tabs and layer 48.

For the embodiment shown, the ceramic layers 34, 36, 38, 40 and 42 are selected as aluminum oxide. The manufacturing of the total assembly is through a process known in the art which includes depositing the predetermined patterns of conductive materials on the surfaces of the ceramic substrates, assembling the substrates thus processed in the form of the integrated circuit package, and co-firing the entire combination of elements. The co-firing results in the levels bonding to one another, and the body 10 becoming a unitary block structure. Known processes are utilized to coat exposed electrical conductive elements with gold plate. It should be understood also, that various portions of the metalized layers 44, 46, 48, 50 and 54 are deposited, depending upon the nature of the integrated circuit that is being interconnected. It is essential, however, that the additional circuit element that forms the heat producing element deposited in metallic layer 52 be maintained electrically insulated from the other conductive paths within the integrated circuit package.

Figure 3:
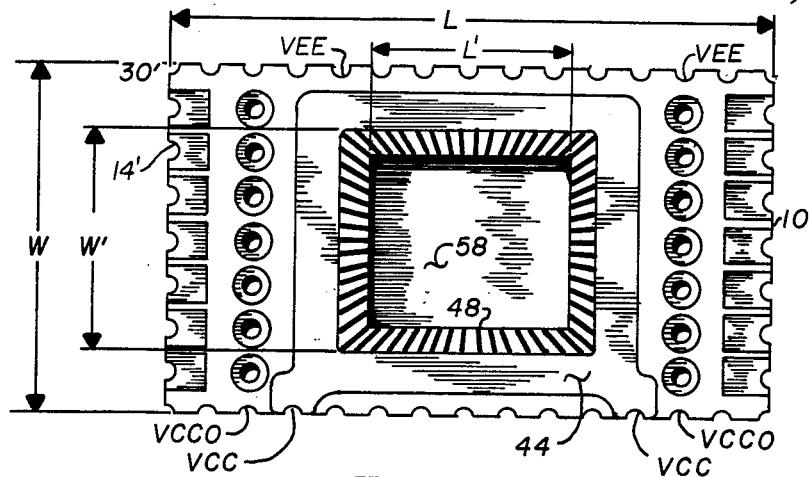
FIG. 3 is a bottom plan view of the integrated circuit package.

FIG. 3 is a bottom plan view of the integrated circuit package 10. In this view, the cover 60 is removed, thereby exposing a cavity 58 in which the integrated circuit die would be situated. Metal layer 44 is shown surrounding the cavity 58 and is utilized to provide power $V_{CC}$. Pin openings 14' for edge pins 16 and 30' for hidden pins 30 are shown for receiving associated pins. A portion of the third metallic layer 48 is shown comprising the bonding to the leads of the integrated circuit die. Power pins $V_{CC}$, $V_{CCO}$, and $V_{EE}$, are shown for illustrative purposes, it being understood that various other configurations of power and signal pins can be implemented. For purposes of illustration, the dimensions of the integrated circuit package 10 has a length L of 0.7 inch, and a width W of 0.4 inch. The opening of cavity 58 has a length L' of 0.245 inch, and a width W' of 0.205 inch. It is of course understood that these dimensions are illustrative only for purposes of demonstrating the small size of the integrated circuit package. Many other size configurations and combinations of metallic layers can be utilized in combination with the additional circuit element that forms the heat producing element deposited in metallic layer 52.

Figure 4:
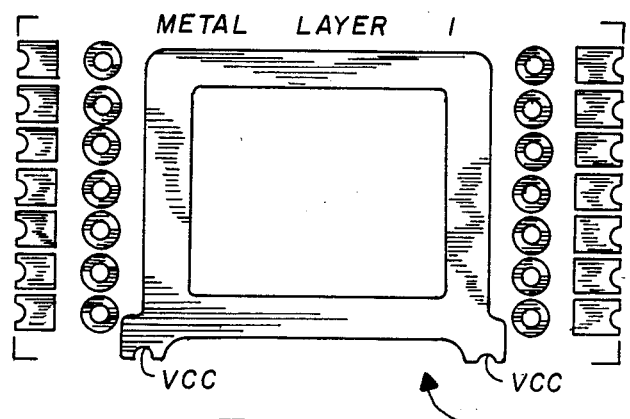
FIG. 4 is an illustrative plan view of a first metallic layer.

FIG. 4 is an illustrative plan view of the first metallic layer 44, and illustrates the power interconnection points $V_{CC}$.

Figure 5:
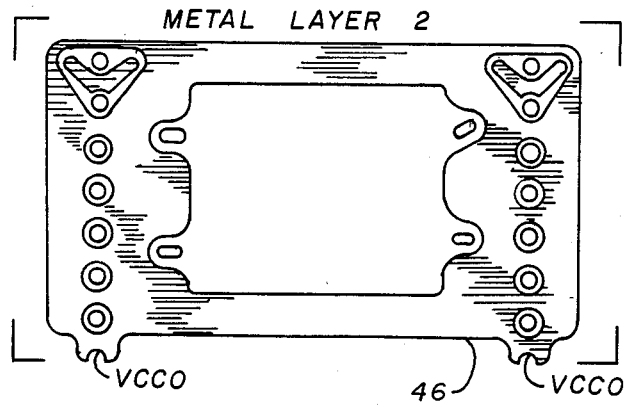
FIG. 5 is an illustrative plan view of a second metallic layer.

FIG. 5 is an illustrative view of the second metallic layer 46, and illustrates the power connections $V_{CCO}$.

Figure 6:
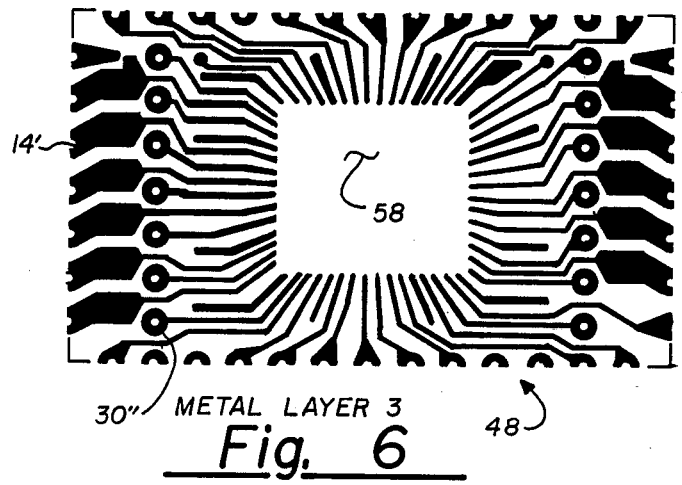
FIG. 6 is an illustrative plan view of a third metallic layer utilized for bonding of the package terminals to the terminals of the integrated circuit.

FIG. 6 is an illustrative view of the third metallic layer 48 utilized for bonding to the terminals of the integrated circuit die (not shown) in the vicinity of cavity 58, and making electrical interconnections to the outer periphery at bonding points 14' and to bond to the hidden pins 30 at bonding points 30".

Figure 7:
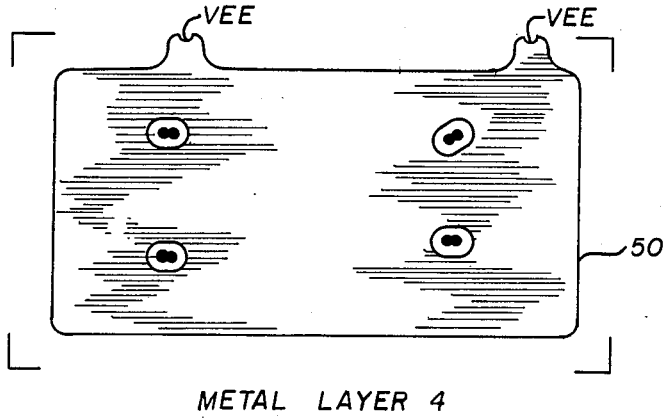
FIG. 7 is an illustrative plan view of a fourth metallic layer.

FIG. 7 is an illustrative plan view of the fourth metallic layer 48, and illustrates the power connection $V_{EE}$.

Figure 8:
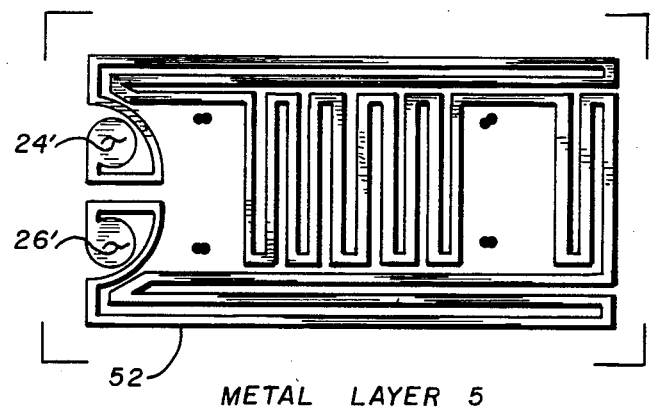
FIG. 8 is a plan view of a fifth metallic layer and illustrates the serpentine pattern of the additional circuit element of the subject invention.

FIG. 8 is a plan view of the fifth metallic layer 52, and illustrates the serpentine pattern of the additional circuit element that is a continuous electrically conductive circuit connection between contact pads 24' and 26'. The contact pads 24' and 26' are physically accessible through apertures 24 and 26, as previously described, for purposes of applying electrical power from an external source (not shown). The element 52 is primarily electrically resistive and is nominally constructed to exhibit approximately 4.5 Ohms resistance at 23° Centigrade to approximately 8 Ohms at 230° Centigrade, and is designed to attain a temperature of approximately 200° Centigrade with the application of approximately 10 watts of power, and preferably not more than 15 watts of power. The additional circuit element 52 is constructed from a refractory metal, otherwise referred to as high temperature metals. Tungsten has been found to yield particularly advantageous operation, but other suitable metals can be utilized. It should be noted that the particular serpentine configuration is particularly suited for the size and shape of the integrated package in which it is to be utilized, and is arranged over substantially all of the surface area so that heat is uniformly generated throughout the integrated circuit package. It is noted further, that the serpentine configuration surrounds open areas on the substrate, thereby allowing for vertical interconnections (not shown) to be made without coming into electrical contact with element 52.

Figure 9:
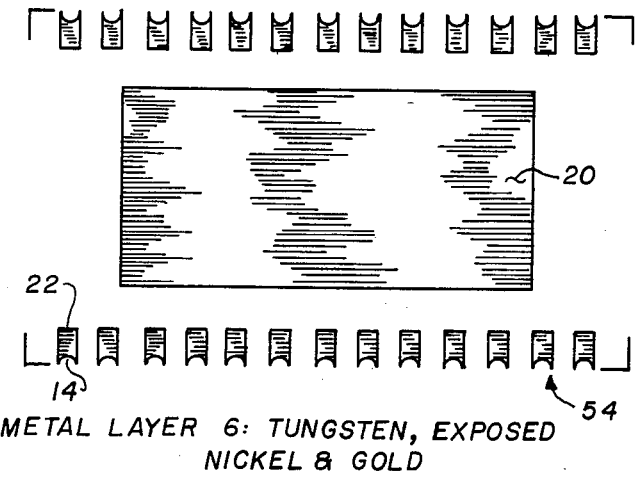
FIG. 9 is an illustrative plan view of a sixth metallic layer.

FIG. 9 is an illustrative plan view of the sixth metallic layer 54 with surface 20 being maintained at power potential $V_{CC}$ through a vertical interconnection (not shown) with the first metallic layer 44. Conductive tabs 22 are in electrical contact with slots 14 for making interconnection with edge pins 16.

As previously described, the six metallic layers illustrated in FIG. 4 through FIG. 9, are each deposited on associated ceramic substrates, which substrates are then stacked and subjected to co-firing for bonding into a unitary integrated circuit package. It should be understood further, that greater or fewer metallic layers can be utilized with the inventive integral heating element, and that other configurations of the metallic layers can be utilized for interconnection with different selections of integrated circuit dies. Further, the resistance of additional circuit element 52 in combination with the applied power can vary without departing from the scope of the invention, for integrated circuit package embodiments that are different from that of the illustrated preferred embodiment, or for use with solders having reflow temperatures different from those described.

Figure 10:
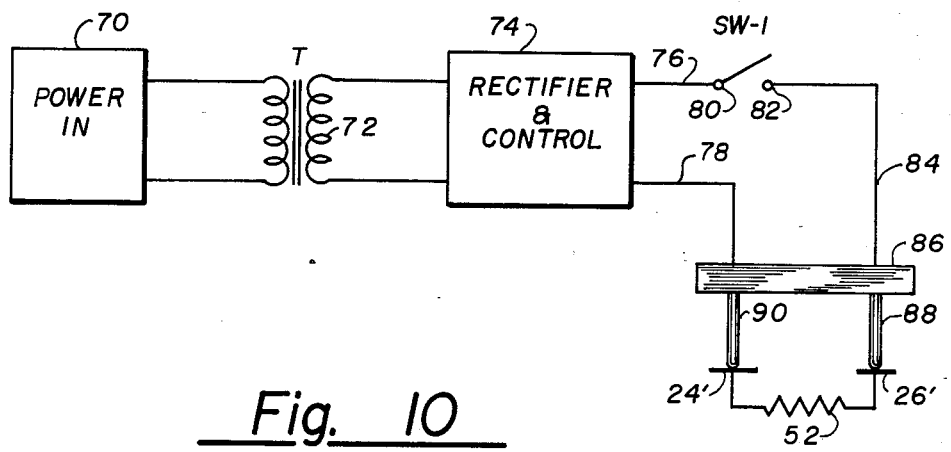
FIG. 10 is a simplified schematic diagram of a system for applying external power to the integrated circuit package for raising its temperature.

FIG. 10 is a simplified schematic diagram of a system for applying external power to the integrated circuit package for raising its temperature. A source of power 70 is coupled to transformer T which has its secondary 72 coupled to a Rectifier and Control circuit 74. The Rectifier and Control circuit 74 functions to establish a voltage level that is compatible with providing the low wattage output across lines 76 and 78. A switch SW-1 has one terminal 80 coupled to line 76 and a second terminal 82 coupled via line 84 through insulated probe handle 86 to probe contact 88. Line 78 is coupled through probe handle 86 to probe contact 90. Probe contacts 88 and 90 are held in spaced apart relationship for cooperation with apertures 24 and 26 in accessing and making electrical contact with contact tabs 24' and 26'. The arrangement is such that the probe contacts 88 and 90 are placed in contact with tabs 26' and 24' respectively, and switch SW-1 is then closed for applying electrical power thereto. The power is dissipated across additional circuit element 52 and its resistive characteristics generates the levels of heat previously described. It can be seen that the use of the integral additional circuit element 52 in combination with the external power source causes heating while it eliminates the thermal shock to the integrated circuit package inherent in the use of application of heat from a contact source, such as a soldering iron, directly to the integrated circuit package.

In operation to remove the integrated circuit package from electrical contact with edge pins 16 and hidden pins 30 in the printed circuit board, power is applied to the terminals 24' and 26', thereby raising the integrated circuit package to a temperature adequate to melt the solder interconnections 62 with edge pins 16 and hidden pins 30, as previously described. Once the removed integrated circuit package with its associated integrated circuit die has been removed, a new integrated circuit package is prepared by applying solder to the contacts that will ultimately be soldered to the edge pins 16 and hidden pins 30. Once the contacts have been pre-soldered, the integrated circuit package is placed in juxtaposition to the associated pins and the power applied to additional circuit element 52. Once the temperature has been raised to a level causing the solder to flow, the entire assembly is urged into contact with the associated pins. Through the use of this system, it is unnecessary to attempt to make contact with a heating source to the individual pin contacts during a resolder operation.

In view of the foregoing detailed description of the preferred embodiment, it can be seen that the various stated purposes and objectives of the invention have been met. Without departing from the spirit and scope of the invention, what is intended to be protected by Letters Patent is set forth in the appended claims.

What is claimed is:

1. An improved integrated circuit package having improved capability for installation and removal comprising:
   a plurality of electrically insulating support members, each having predetermined patterns of electrically conductive materials deposited on at least portions thereof, predetermined ones of said electrically insulating support members having first access apertures, and other predetermined ones of said electrically insulating support members having pin receiving apertures;
   a further electrically insulating support member positioned between said predetermined ones and said other predetermined ones of said electrically insulating support members;
   an auxiliary heat generating element deposited in a predetermined pattern on said further electrically insulating support member and having receiving means associated therewith and in cooperative relation to said first access apertures, said auxiliary heat generating element arranged for providing heat at a predetermined level in response to external electrical power applied to said receiving means;
   said pluarlity of electrically insulating support members and said further electrically insulated support member arranged in juxtaposition such that all of said electrically conductive materials are electrically insulated from said auxiliary heat generating element, and are formed in a unitary body; and
   interconnection means, including solder connections, for making electrical and physical interconnection between portions of said electrically conductive materials and associated interconnection pins in said pin receiving apertures when said solder is caused to flow in response to said heat at a predetermined level in response to application of said external electrical power.

2. An integrated circuit package as in claim 11 wherein said auxiliary heat generating means comprises:
   electrically conductive means exhibiting predetermined electrical resistance characteristics, and responsively coupled to said receiving means and arranged in a predetermined serpentine configuration for applying evenly distributed heat to said unitary body in response to said electrical power applied to said receiving means.

3. An integrated circuit package as in claim 2 wherein said electrical resistance characteristic is predetermined to raise the temperature of the combination of elements to not more than 200° Centigrade when said electrical power at predetermined levels is predetermiend and externally applied at not more than 15 watts.

4. An integrated circuit package as in claim 2 wherein said heat generating means is fabricated from a selective one of available refractory metals.

5. An improved integrated circuit package having improved capability for solder reflow installation and removal comprising:
   a plurality of ceramic support members each having predetermined patterns of electrically conductive materials deposited on at least portions thereof, and predetermined ones having first access apertures and other predetermined ones having pin receiving apertures;
   a further ceramic support member positioned between said predetermined ones and said other predetermined ones of saidceramic support members;
   an auxiliary heat generating element deposited in a predetermined pattern on said further ceramic support member, and having receiving means in cooperation with said first access apertures;
   said plurality of ceramic support members and said further ceramic support member arranged so that all of said electrically conductive materials are electrically isolated from said heat generating element and co-fired to form a unitary body;
   interconnection means, including solder connections, for making electrical and physical interconnection between predetermined portions of said electrically conductive material and associated interconnection pins, in said pin receiving apertures; and
   said receiving means is arranged for receiving external electrical power to be applied to said auxiliary heat generating element for allowing said external electrical power to be applied thereto for raising the temperature of said unitary body to predetermined levels for causing said solder to melt and flow at said interconnection pins.

6. An integrated circuit package as in claim 5 wherein said auxiliary heat generating element comprises:
   electrically conductive means exhibiting predetermined electrical resistance characteristics, and responsively electrically coupled to said receiving means and arranged in a predetermined serpentine configuration for applying evenly distributed heat to said unitary body in response to application of said external electrical power.

7. An integrated circuit package as in claim 6 wherein said electrical resistance characteristics are predetermined to raise the temperature of said unitary body to not more than 200° Centigrade when said external electrical power is applied at predetermined levels of not more than 15 watts.

8. An integrated circuit package as in claim 7 wherein said heat generating element is fabricated from a selected one of available refractory metals, and said ceramic support members are alumina.

9. An improved integrated circuit package as in claim 1 wherein at least some of said pin receiving apertures are hidden from view and direct physical access when connected to associated ones of said pins.

10. An improved integrated circuit package as in claim 5 wherein at least some of said pin receiving apertures are hidden from view and direct physical access when connected to associated ones of said pins.

11. An improved integrated circuit package comprising:
   a plurality of electrically insulated support members, each having predetermined patterns of electrically conductive materials deposited on at least portions thereof, predetermined ones of said support members having pin receiving apertures therein, and said plurality of insulated support members arranged in juxtapostion such that all of said electrically conductive materials are electrically insulated from each other, and are formed in a unitary body;
   cavity means formed in said unitary body for supporting an associated integrated circuit device, said cavity means opens in the same direction as said pin receiving apertures; and
   interconnection means, including solder connections, for making electrical and physical interconnection between portions of said electrically conductive materials and associated interconnection pins and the associated integrated circuit device, when at least some of said pin receiving apertures and said cavity means are hidden from view and direct physical access when the integrated circuit package is connected to associated ones of said pins.

12. An improved integrated circuit package as in claim 11 wherein predetermined ones of said plurality of support members have first access apertures and one of said plurality of support members has an auxiliary heat generating element deposited in a predetermined pattern thereon and includes receiving means associated therewith and in cooperative relation to said first access apertures, said auxiliary heat generating element arranged for providing heat at a predetermined level in response to external electrical power applied to said receiving means, wherein said solder is caused to flow in response to said heat at a predetermined level in response to application of said external electrical power.

13. An improved integrated circuit package as in claim 12 wherein said auxiliary heat generating element comprises:
   electrically conductive means exhibiting predetermined electrical resistance characteristics, and responsively coupled to said receiving means and arranged in a predetermined serpentine configuration for applying evenly distributed heat to said unitary body in response to said electrical power applied to said receiving means.

14. An improved integrated circuit package as in claim 13 wherein said first access apertures are disposed oppositely on said unitary body to said pin receiving apertures and said cavity means for providing ready access to said first access apertures.

* * * * *

UNITED STATES PATENT AND TRADEMARK OFFICE
CERTIFICATE OF CORRECTION

PATENT NO. : 4,561,006

DATED : December 24, 1985

INVENTOR(S) : Thomas P. Currie

It is certified that error appears in the above-identified patent and that said Letters Patent is hereby corrected as shown below:

<u>IN THE PRINTED PATENT</u>

In the Claims:

Column 8, Line 35, "predetermiend" should be --predetermined--

Column 8, Line 51, "saidceramic" should be --said ceramic--

Signed and Sealed this

Thirteenth Day of May 1986

[SEAL]

Attest:

DONALD J. QUIGG

Attesting Officer

Commissioner of Patents and Trademarks